United States Patent
Kao

(10) Patent No.: US 7,456,451 B2
(45) Date of Patent: Nov. 25, 2008

(54) ULTRA HIGH VOLTAGE MOS TRANSISTOR DEVICE

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 513 days.

(21) Appl. No.: 11/162,491

(22) Filed: Sep. 13, 2005

(65) Prior Publication Data

US 2007/0057293 A1   Mar. 15, 2007

(51) Int. Cl.
*H01L 29/72* (2006.01)
(52) U.S. Cl. .............. 257/288; 257/324; 257/341; 257/401; 257/409; 257/630
(58) Field of Classification Search ............. 257/288, 257/324, 341, 401, 409, 630
See application file for complete search history.

(56) References Cited

U.S. PATENT DOCUMENTS 4,290,077 A * 9/1981 Ronen ..................... 257/409
6,306,721 B1 * 10/2001 Teo et al. ................. 438/396
6,468,837 B1 * 10/2002 Pendharkar et al. ...... 438/140
6,620,688 B2 * 9/2003 Woo et al. ................ 438/262

* cited by examiner

Primary Examiner—Edward Wojciechowicz
(74) Attorney, Agent, or Firm—Winston Hsu

(57) ABSTRACT

An ultra high voltage MOS transistor device includes a substrate of a first conductivity type; a source region of a second conductivity type formed in the substrate; a first doping region of the first conductivity type formed in the substrate and bordering upon the source region; a first ion well of the first conductivity type encompassing the source region and the first doping region; a gate oxide layer formed on the source region and on the first ion well; a field oxide layer connected with the gate oxide layer and formed on a semiconductor region; a dielectric layer stacked on the field oxide layer; a drain region of the second conductivity type formed at one side of the field oxide layer and being spaced apart from the source region; a second ion well of the second conductivity type encompassing the drain region; and a gate disposed on the gate oxide layer and laterally extending to the field oxide layer and onto the dielectric layer.

16 Claims, 4 Drawing Sheets

ULTRA HIGH VOLTAGE MOS TRANSISTOR DEVICE

BACKGROUND OF THE INVENTION

1. Field of the Invention

The present invention relates to ultra high voltage semiconductor devices and, more particularly, to an ultra high voltage MOS transistor capable of alleviating or eliminating high vertical electric field effect caused by the gate edge, and being compatible with low-voltage device.

2. Description of the Prior Art

High voltage or ultra high voltage metal-oxide-semiconductor (MOS) transistor devices are known in the art. Ordinarily, an ultra high voltage MOS transistor device can sustain a drain voltage of several hundreds or thousands volts. FIG. 1 schematically illustrates a cross-sectional view of a prior art ultra high voltage NMOS transistor device. The prior art ultra high voltage NMOS transistor device 1 is fabricated on an active area of a semiconductor substrate 10 such as a P type silicon substrate. The active area is defined with a peripheral field oxide layer 44. The ultra high voltage NMOS transistor device 1 comprises a heavily N doped source 14, a gate 50 and a heavily N doped drain 24. The heavily N doped source 14 borders upon a heavily P doped region 16, both of which are formed within a P well 12. The distance between the drain 24 and the source 14 may be few micrometers. As shown in FIG. 1, the heavily N doped drain 24 is formed within a grade N well 22 that is formed within a deep N well 30.

A gate oxide film 46 is formed on the heavily N doped source 14. The gate 50 is formed on the gate oxide film 46 and laterally extends over a field oxide layer 42 that is formed on the semiconductor substrate 10 between the source 14 and drain 24. A plurality of floating field plates 52 are disposed on the field oxide layer 42 between the gate 50 and the drain 24. These electrically floating field plates 52 are used to disturb lateral electric field when this ultra high voltage MOS device is in operation. Like the peripheral field oxide layer 44, the field oxide layer 42 is formed using conventional local oxidation of silicon (LOCOS) technique. To prevent breakdown of the MOS device operated at a high voltage ranging between hundreds and thousands volts, a very thick field oxide layer 42 having a thickness t of at least 10,000 angstroms is required. It is evident that when the thickness t of the field oxide layer 42 is greater than 10,000 angstroms, the high vertical electric field caused by the sharp lower gate edge 70 can be significantly reduced.

However, it is problematic to form such thick field oxide layer 42 because it takes extra time. The wafers will have to stay in the furnace longer, and this means reduced throughput. Further, a thicker field oxide layer also leads to severer bird's beak effect on the low-voltage device area, and thus consuming more valuable chip surface area. Therefore, there is a need in this industry to provide an improved ultra high voltage MOS transistor device that is compatible with low voltage device having field oxide thickness of about 5,000-6,000 angstroms and, on the other hand, the ultra high voltage MOS transistor device is capable of solving high vertical electric field caused by the gate edge.

SUMMARY OF THE INVENTION

It is the primary object of the present invention to provide an improved ultra high voltage MOS transistor device that is compatible with low voltage devices, and such ultra high voltage MOS transistor device is capable of solving high vertical electric field caused by the gate edge.

According to the claimed invention, an ultra high voltage metal-oxide-semiconductor (MOS) transistor device is disclosed. The ultra high voltage MOS transistor device includes a substrate of a first conductivity type; a source region of a second conductivity type formed in the substrate; a first doping region of the first conductivity type formed in the substrate and bordering upon the source region; a first ion well of the first conductivity type encompassing the source region and the first doping region; a gate oxide layer formed on the source region and on the first ion well; a field oxide layer connected with the gate oxide layer and formed on a semiconductor region; a dielectric layer stacked on the field oxide layer; a drain region of the second conductivity type formed at one side of the field oxide layer and being spaced apart from the source region; a second ion well of the second conductivity type encompassing the drain region; and a gate disposed on the gate oxide layer and laterally extending to the field oxide layer and onto the dielectric layer.

From one aspect of this invention, the ultra high voltage MOS transistor device includes an epitaxial layer; a first ion well of a first conductivity type formed in the epitaxial layer; a source region of a second conductivity type formed in the first ion well; a first doping region of the first conductivity type formed in the first ion well and bordering upon the source region; a gate oxide layer formed on the source region and on the first ion well; a second ion well of the second conductivity type formed in the epitaxial layer; a drain region of the second conductivity type formed in the second ion well; a field oxide layer connected with the gate oxide layer and being formed on the epitaxial layer between the first ion well and the drain region; a dielectric layer stacked on the field oxide layer; and a gate disposed on the gate oxide layer and laterally extending to the field oxide layer and onto the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
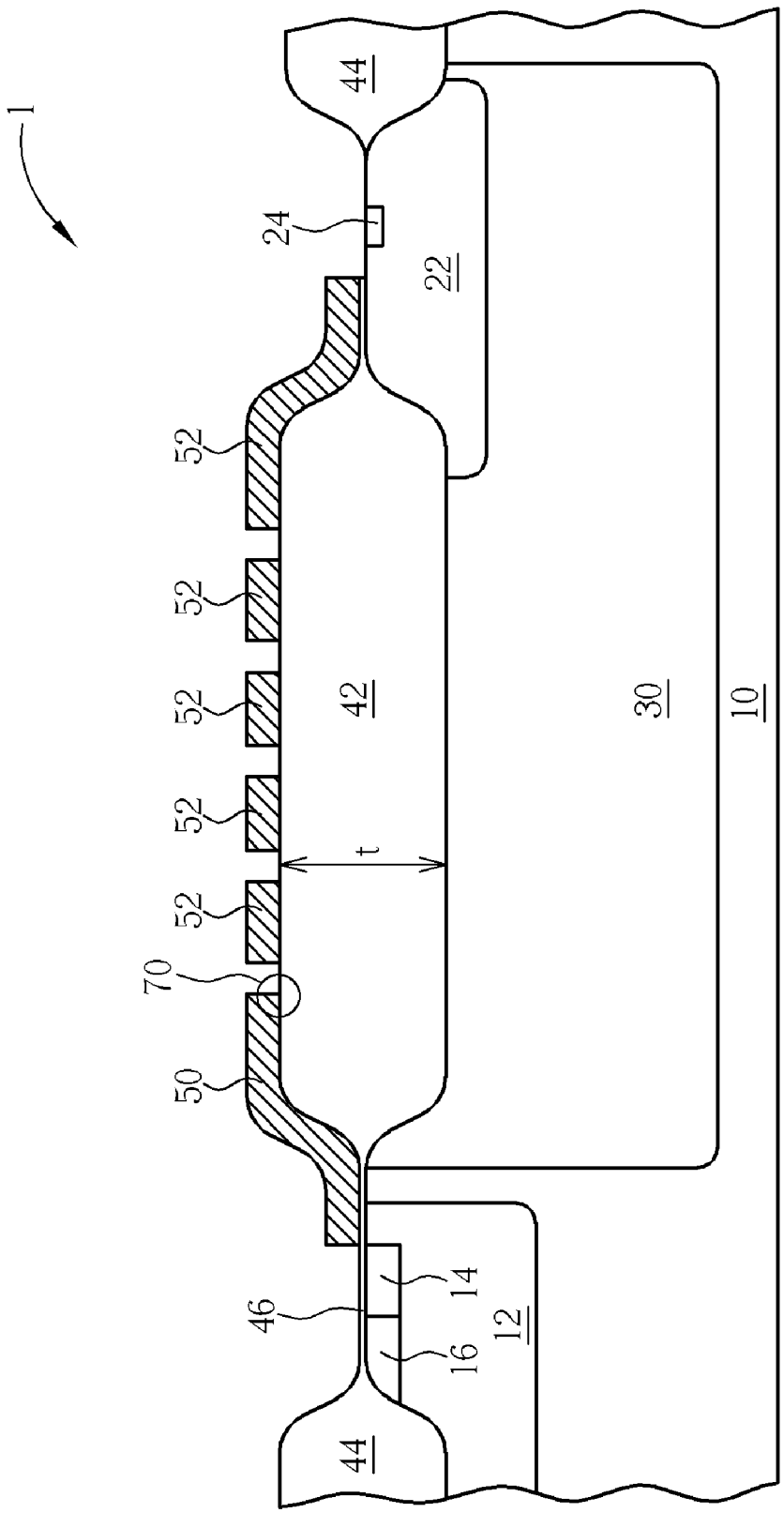
FIG. 1 schematically illustrates a cross-sectional view of a prior art ultra high voltage NMOS transistor device.
Figure 2:
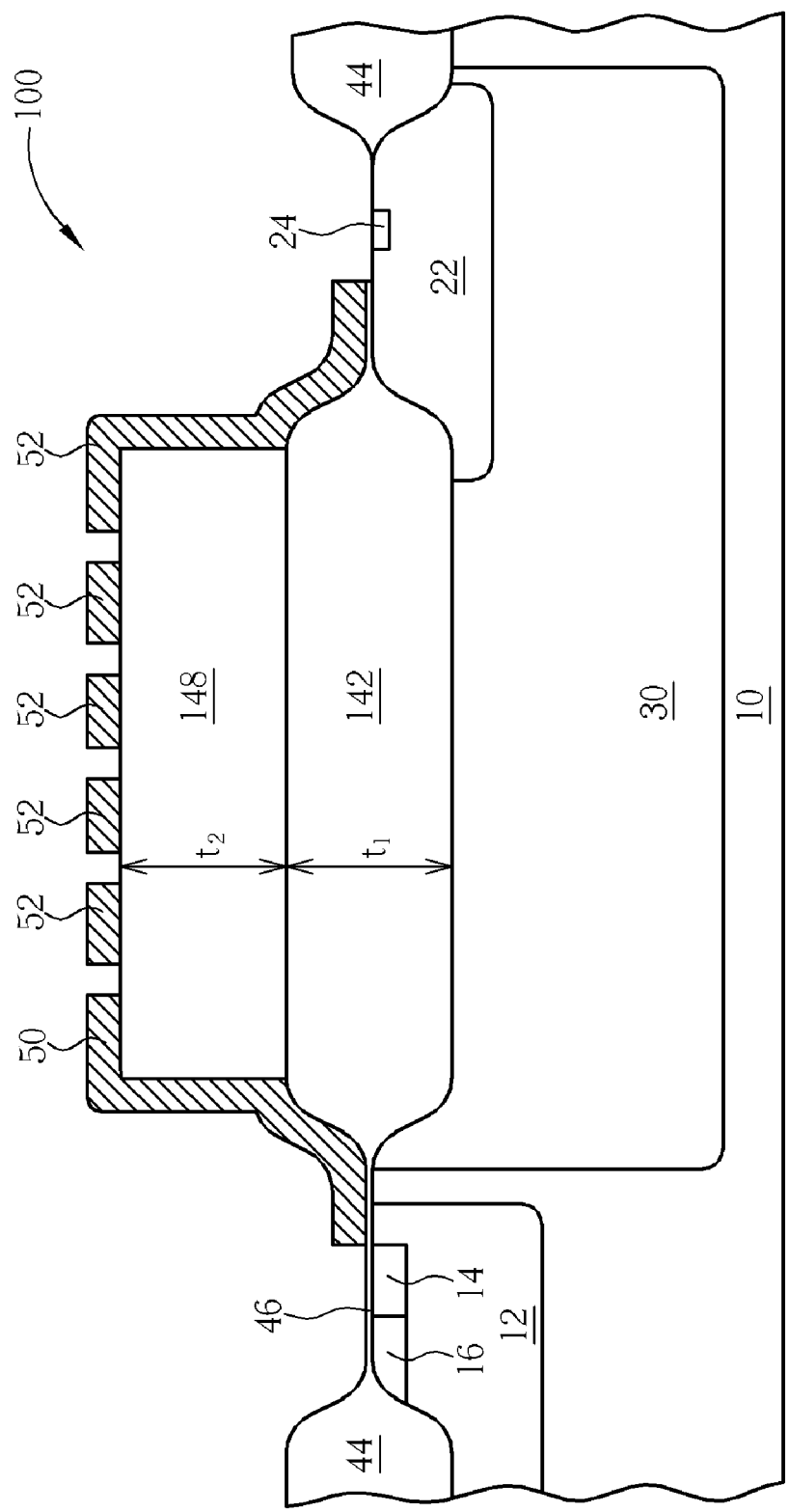
FIG. 2 is a schematic cross-sectional diagram illustrating an ultra high voltage NMOS transistor device in accordance with one preferred embodiment of this invention.

FIG. 2 is a schematic cross-sectional diagram illustrating an ultra high voltage NMOS transistor device in accordance with one preferred embodiment of this invention. It is understood that the polarities shown in figures are exemplary, and suitable modification of the polarities can be made to form an ultra high voltage PMOS transistor device.

According to the preferred embodiment, the ultra high NMOS transistor device 100 is formed on an active area of a semiconductor substrate 10 such as a P type silicon substrate. The active area is defined and isolated with a peripheral field oxide layer 44. Likewise, the ultra high NMOS transistor device 100 comprises a heavily N doped source 14, a gate 50 and a heavily N doped drain 24. The heavily N doped source 14 borders upon a heavily P doped region 16, both of which are formed within a P well 12. The distance between the drain 24 and the source 14 may be few micrometers. The heavily N doped drain 24 is formed within a grade N well 22 that is formed within a deep N well 30. The gate 50 may be made of polysilicon or metals.

A gate oxide film 46 is formed on the heavily N doped source 14. The gate 50 is formed on the gate oxide film 46 and laterally extends over a field oxide layer 142 and onto a dielectric layer 148 stacked on the field oxide layer 142. A plurality of floating field plates 52 are disposed on the dielectric layer 148 and field oxide layer 142 between the gate 50 and the drain 24. These electrically floating field plates 52 are used to disturb lateral electric field when this ultra high voltage MOS device is in operation. Like the peripheral field oxide layer 44, the field oxide layer 142 is formed on the semiconductor substrate 10 between the source 14 and drain 24 using conventional local oxidation of silicon (LOCOS) technique. The field oxide layer 142 has a thickness $t_1$, ranging between about 5,000 and 6,000 angstroms. The present invention features the dielectric layer 148 having a thickness $t_2$ stacked on the field oxide layer 142. According to the preferred embodiment, the thickness $t_2$ ranges between 10,000 and 15,000 angstroms, much thicker than the field oxide layer 142.

According to the preferred embodiment, the dielectric layer 148 is silicon oxide deposited by conventional chemical vapor deposition (CVD) methods. In some cases, the dielectric layer 148 may be formed by firstly depositing a doped polysilicon layer over the field oxide layer 142, followed by thermally oxidizing the doped polysilicon layer. By doing this, the gate 50 is elevated while keeps the thickness of the underlying field oxide layer 142 at an acceptable level, for example, 5,000 to 6,000 angstroms, which is compatible with low-voltage devices. The combined thickness of the field oxide layer 142 and the dielectric layer 148 ($t_1+t_2$) may ranges between 18,000 angstroms and 20,000 angstroms. In the preferred embodiment, the underlying field oxide layer that is formed using LOCOS methods is denser than the CVD silicon oxide dielectric layer 148.

Figure 3:
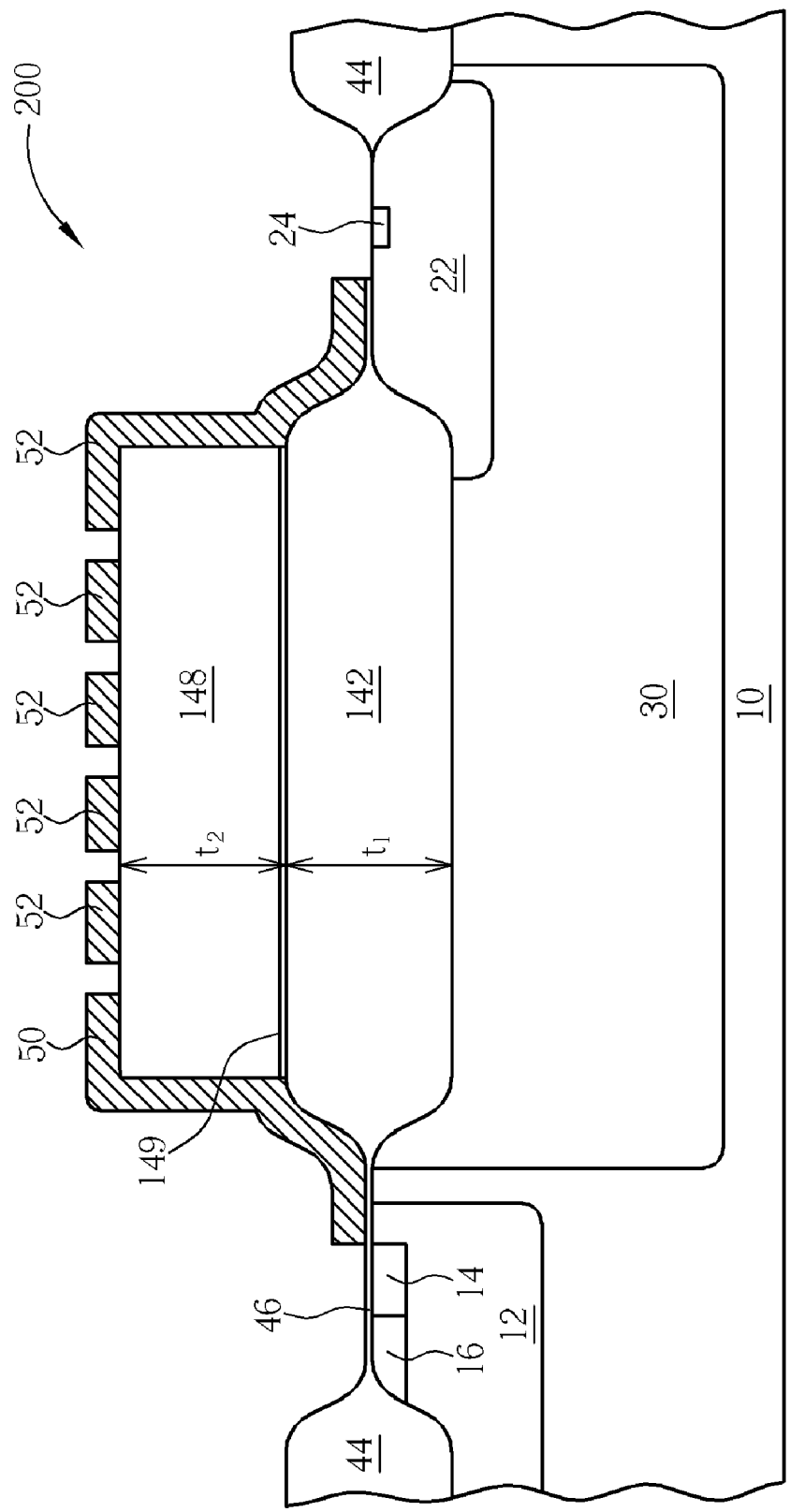
FIG. 3 is a schematic cross-sectional diagram illustrating an ultra high voltage NMOS transistor device in accordance with another preferred embodiment of this invention.

Referring to FIG. 3, an ultra high voltage NMOS transistor device 200 according to another preferred embodiment of this invention is illustrated. The difference between the previous preferred embodiment as depicted in FIG. 2 and the ultra high voltage NMOS transistor device 200 shown in FIG. 3 is that the dielectric layer 148 of the ultra high voltage NMOS transistor device 200 further comprises an etching stop layer 149 such as silicon nitride layer. Furthermore, the dielectric layer 148 may be made of low-k (k<4.0) materials such as porous silicon dioxide.

Figure 4:
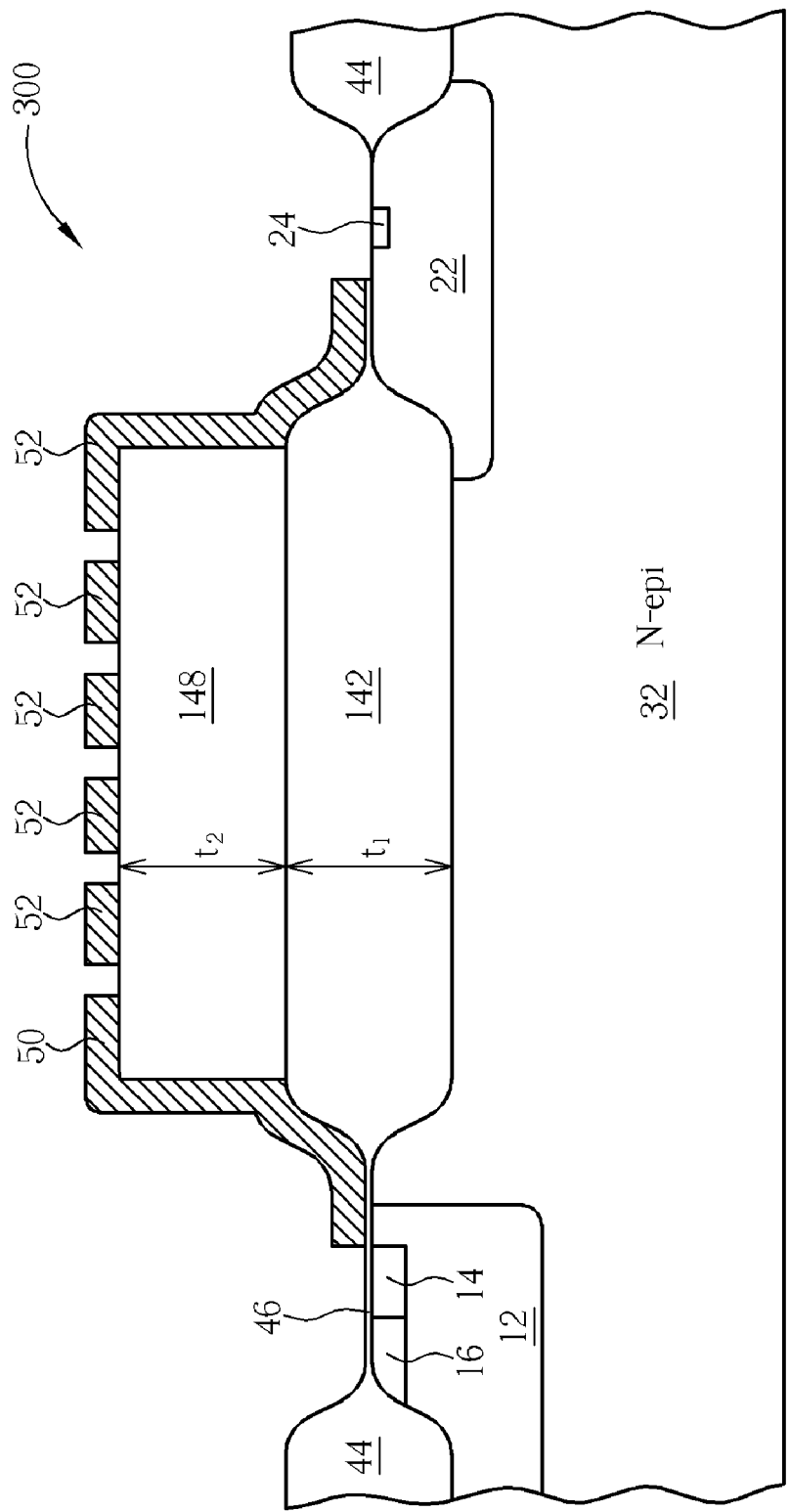
FIG. 4 is a schematic cross-sectional diagram illustrating an ultra high voltage NMOS transistor device in accordance with still another preferred embodiment of this invention.

Referring to FIG. 4, an ultra high voltage NMOS transistor device 300 according to still another preferred embodiment of this invention is illustrated. The difference between the previous preferred embodiment as depicted in FIG. 2 and the ultra high voltage NMOS transistor device 300 shown in FIG. 4 is that the deep N well 30 of the previous preferred embodiment as depicted in FIG. 2 is now replaced with an N type epitaxial silicon layer 32. The P well 12 and the N well are formed in the N type epitaxial silicon layer 32.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ultra high voltage metal-oxide-semiconductor (MOS) transistor device, comprising:
   a substrate of a first conductivity type;
   a source region of a second conductivity type formed in the substrate;
   a first doping region of the first conductivity type formed in the substrate and bordering upon the source region;
   a first ion well of the first conductivity type encompassing the source region and the first doping region;
   a gate oxide layer formed on the source region and on the first ion well;
   a field oxide layer connected with the gate oxide layer and formed on a semiconductor region;
   a dielectric layer stacked on the field oxide layer, wherein the dielectric layer is thicker than the field oxide layer;
   a drain region of the second conductivity type formed at one side of the field oxide layer and being spaced apart from the source region;
   a second ion well of the second conductivity type encompassing the drain region; and
   a gate disposed on the gate oxide layer and laterally extending to the field oxide layer and onto the dielectric layer.

2. The ultra high voltage MOS transistor device according to claim 1 wherein a plurality of floating field plates are disposed on the dielectric layer and the field oxide layer between the gate and the drain region.

3. The ultra high voltage MOS transistor device according to claim 1 wherein the dielectric layer is a CVD dielectric layer and wherein the field oxide layer is denser than the dielectric layer.

4. The ultra high voltage MOS transistor device according to claim 1 wherein a third ion well of the second conductivity type is formed in the substrate underneath the field oxide layer and the third ion well encompasses the second ion well.

5. The ultra high voltage MOS transistor device according to claim 1 wherein the field oxide layer has a first thickness of about 5,000-6,000 angstroms such that the ultra high voltage MOS transistor device is compatible with low-voltage devices.

6. The ultra high voltage MOS transistor device according to claim 1 wherein the dielectric layer has a second thickness of about 10,000-15,000 angstroms.

7. The ultra high voltage MOS transistor device according to claim 1 wherein the dielectric layer further comprises an etching stop layer that is merely interposed between the dielectric layer and the field oxide layer.

8. The ultra high voltage MOS transistor device according to claim 7 wherein the etching stop layer is a silicon nitride layer.

9. An ultra high voltage metal-oxide-semiconductor (MOS) transistor device, comprising:
   an epitaxial layer;
   a first ion well of a first conductivity type formed in the epitaxial layer;
   a source region of a second conductivity type formed in the first ion well;
   a first doping region of the first conductivity type formed in the first ion well and bordering upon the source region;
   a gate oxide layer formed on the source region and on the first ion well;
   a second ion well of the second conductivity type formed in the epitaxial layer;
   a drain region of the second conductivity type formed in the second ion well;

a field oxide layer connected with the gate oxide layer and being formed on the epitaxial layer between the first ion well and the drain region;

a dielectric layer stacked on the field oxide layer, wherein the dielectric layer is thicker than the field oxide layer; and a gate disposed on the gate oxide layer and laterally extending to the field oxide layer and onto the dielectric layer.

10. The ultra high voltage MOS transistor device according to claim 9 wherein the epitaxial layer is of the second conductivity type.

11. The ultra high voltage MOS transistor device according to claim 9 wherein a plurality of floating field plates are disposed on the dielectric layer and the field oxide layer between the gate and the drain region.

12. The ultra high voltage MOS transistor device according to claim 9 wherein the dielectric layer is a CVD dielectric layer and wherein the field oxide layer is denser than the dielectric layer.

13. The ultra high voltage MOS transistor device according to claim 9 wherein the field oxide layer has a first thickness of about 5,000-6,000 angstroms such that the ultra high voltage MOS transistor device is compatible with low-voltage devices.

14. The ultra high voltage MOS transistor device according to claim 9 wherein the dielectric layer has a second thickness of about 10,000-15,000 angstroms.

15. The ultra high voltage MOS transistor device according to claim 9 wherein the gate is made of polysilicon.

16. The ultra high voltage MOS transistor device according to claim 9 wherein the gate is metal gate.

* * * * *